United States Patent
Ibe

[11] Patent Number: 5,201,145
[45] Date of Patent: Apr. 13, 1993

[54] MONOCRYSTAL INGOT ATTITUDE-ADJUSTING/SURFACE-GRINDING/CONVEYING APPARATUS

[75] Inventor: Hiroyuki Ibe, Nyu, Japan

[73] Assignee: Shin-Etsu Handotai Company, Limited, Tokyo, Japan

[21] Appl. No.: 679,509

[22] Filed: Apr. 1, 1991

[30] Foreign Application Priority Data

Mar. 31, 1990 [JP] Japan .................................. 2-85937
Mar. 31, 1990 [JP] Japan .................................. 2-85938
Mar. 31, 1990 [JP] Japan .................................. 2-85939

[51] Int. Cl.$^5$ ............................................ B24B 49/00
[52] U.S. Cl. ............................ 51/165.71; 51/165.72; 51/76 R; 51/105 R; 51/3; 51/289 R
[58] Field of Search ........... 51/165.71, 165.72, 165.75, 51/165.77, 165 R, 76 R, 3, 103 R, 103 C, 105 R, 216 R, 236, 237 R, 289 R

[56] References Cited

U.S. PATENT DOCUMENTS

| | | | |
|---|---|---|---|
| 4,651,472 | 3/1987 | Scheder et al. | 51/165.73 |
| 4,879,846 | 11/1989 | Menard et al. | 51/137 |
| 4,951,422 | 8/1990 | Ibe et al. | 51/165.71 |
| 5,007,204 | 4/1991 | Ibe et al. | 51/165.71 |

FOREIGN PATENT DOCUMENTS

| | | |
|---|---|---|
| 387130 | 9/1990 | European Pat. Off. . |
| 2127106 | 12/1972 | Fed. Rep. of Germany . |
| 2927650 | 1/1980 | Fed. Rep. of Germany . |
| 238938 | 9/1986 | German Democratic Rep. . |
| 1124877 | 8/1968 | United Kingdom . |
| 8701333 | 3/1987 | World Int. Prop. O. . |

Primary Examiner—M. Rachuba
Attorney, Agent, or Firm—Browdy and Neimark

[57] ABSTRACT

A monocrystal ingot conveying/surface grinding apparatus has a plurality of surface grinding devices 221A to 225A disposed serially, a rail 16A disposed adjacent to the ceiling along the devices, a conveying/attitude-adjusting device 20A guided by the rail 16A and having an X-Y-$\theta$-$\phi$ stage 24 and conveyers 14 and 23 disposed below an end portion of the rail 16A and arranged to convey monocrystal ingots 10 before they are ground. The attitude of the monocrystal ingot 10 is adjusted so as to make the grinding rotation center of the monocrystal ingot 10 coincide with the center of each of clamp rotational shafts 70A and 70B of each of the surface grinding devices 221A to 225A. Furthermore, the surfaces of the monocrystal ingots 10 are ground to form cylindrical shapes by the surface grinding devices 221A to 225A, the monocrystal ingots 10 being conveyed by the conveying/attitude-adjusting device 20A and the conveyers 14 and 23. Endoscopes 82A and 82B are inserted into through holes 79A and 79B formed in the shaft core portions of the rotational clamp shafts so that the two end surfaces of the monocrystal ingot 10 are imaged by cameras 84A and 84B.

9 Claims, 16 Drawing Sheets

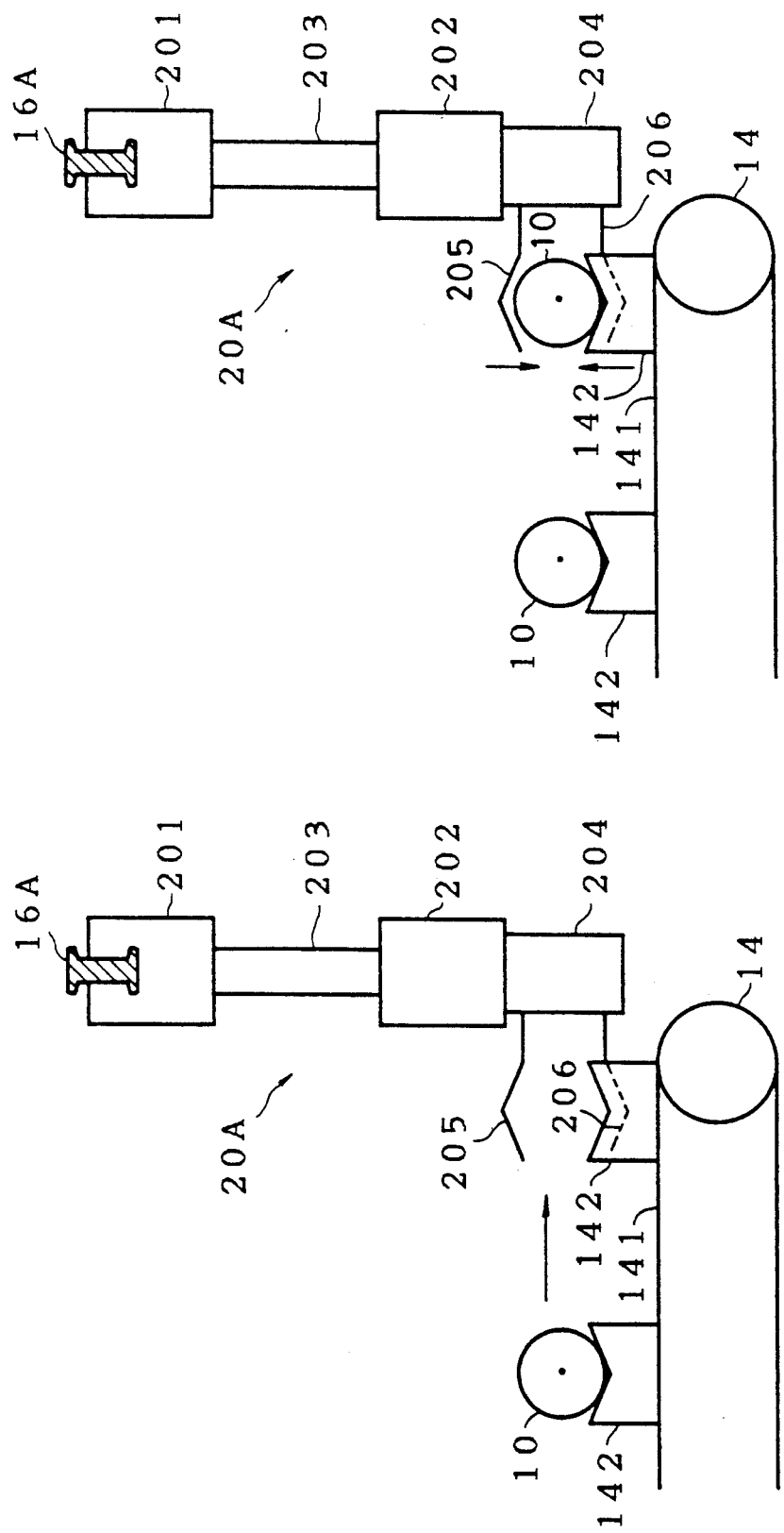

MONITOR SCREEN A    MONITOR SCREEN B
(A) 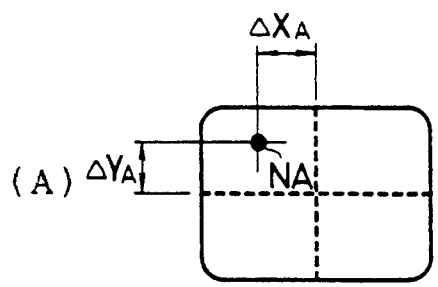 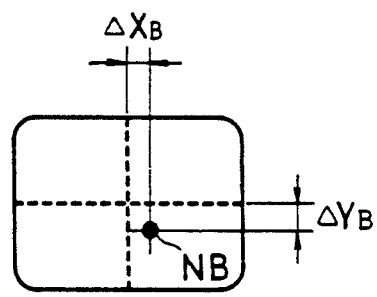
(B) 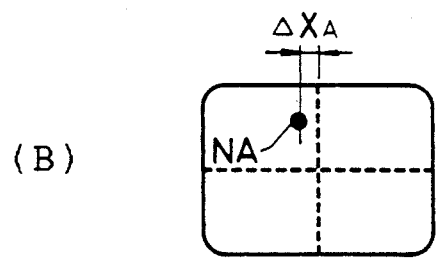 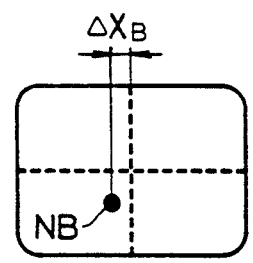   $\Delta X_A = \Delta B_B$
(C) 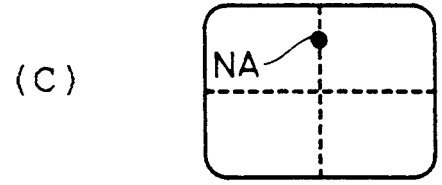 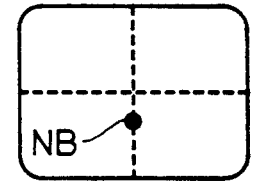   $\Delta X_A = \Delta X_B = 0$
(D) 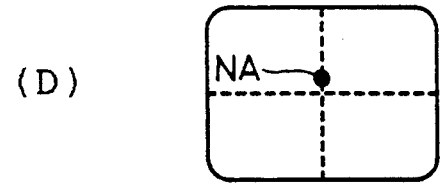 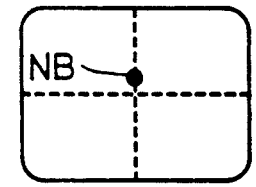   $\Delta Y_A = \Delta Y_B$
(E) 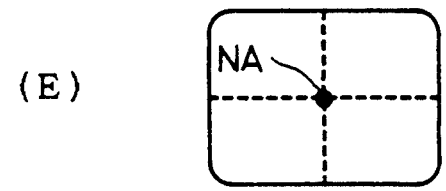 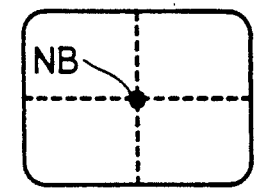   $\Delta Y_A = \Delta Y_B = 0$
Fig. 13

MONOCRYSTAL INGOT ATTITUDE-ADJUSTING/SURFACE-GRINDING-/CONVEYING APPARATUS

BACKGROUND OF THE INVENTION

The present invention relates to a monocrystal ingot attitude-adjusting/surface-grinding/conveying apparatus for adjusting the attitude of a monocrystal ingot in such a manner that the grinding rotation center of the monocrystal ingot is made coincide with the center of the clamp rotational shaft of a surface grinding device, grinding the surface of the monocrystal ingot to form a cylindrical shape by the surface grinding device and conveying the monocrystal ingot after it has been ground Monocrystal ingots manufactured by a CZ method or an FZ method are respectively made to be in the form of a cylinder by the following processes (1) The conical two end portions of the monocrystal ingot are cut off in a direction perpendicular to its axis so that the monocrystal ingot is made to be in the form of a substantially cylindrical shape (2) The monocrystal ingot placed on a carrier is manually carried before an operator holds it so as to set it to the rotational clamp shafts of a rotating device While manually rotating the monocrystal ingot, the quantity of the deviation of the rotation center of the monocrystal ingot from the rotation center of the rotational clamp shafts is intentionally determined depending upon the sense of an operator for the purpose of making the diameter of the ground monocrystal ingot to be the maximum diameter. The operator knocks the surface of the monocrystal ingot with a hammer so as to correct the above-described deviation.

(3) In this state, the rotational clamp shafts are abutted against the end surfaces of the monocrystal ingot with large force. Subsequently, the monocrystal ingot is rotated, and a grindstone is translated while being abutted against the surface of the monocrystal ingot by a grindstone moving device. As a result, the side of the monocrystal ingot is ground to form a cylindrical shape.

Hitherto, the working efficiency has been insufficient since the process (2) has been performed by an operator.

In order to automate the above-described process, it might be considered feasible to employ an apparatus arranged in such a manner that a robot for loading/unloading the monocrystal ingot is provided for each of the monocrystal ingot grinding devices and a monocrystal ingot conveying device is provided along with the above-described robots.

However, a problem arises in that the size of the apparatus becomes too large, causing the cost of equipment to also be enlarged excessively. Furthermore, the required space becomes too large Furthermore, since the above-described quantity of the deviation has been detected by the sense of the operator, the above-described two centers have not been made accurately coincide with each other. Therefore, an excessively large quantity of the surface layer of the monocrystal ingot has been undesirably ground, causing a large economical loss to be generated.

In order to automate the above-described process and as well as to make the two centers accurately coincide with each other, it is necessary to use a monocrystal ingot attitude adjusting device having a pair of hands for holding the monocrystal ingot, the monocrystal ingot attitude adjusting device being capable of adjusting the position of each of the hands The monocrystal ingot attitude adjusting device may further include two X-Y stages for moving the hands independently in a vertical plane. However, another problem takes place in this case in that the width of the monocrystal ingot attitude adjusting device cannot be reduced satisfactorily. What is even worse, the grinding rotation center of the monocrystal ingot cannot be made accurately coincide with the rotation center line of the rotational clamp shaft That is, two operational steps must be performed in order to make the grinding rotation center line to parallel the rotation center line of the rotational clamp shaft Furthermore, two operational steps must be performed for the purpose of making the above-described two center lines coincide with each other. However, if the motors for respectively operating the two hands are rotated for the same time, the two center lines cannot be accurately made coincide with each other because of the difference between the stoppage accuracies of the two motors and the mechanical dimensional errors between the two hands. Therefore, if the two hands are individually operated, excessively large force is applied to undesirably strain the monocrystal ingot

SUMMARY OF THE INVENTION

In view of these problems, it is an object of the present invention to provide a monocrystal ingot conveying/surface-grinding apparatus the overall structure of which can be simplified.

A second object of the present invention is to provide a monocrystal ingot attitude adjusting device capable of accurately and desirably adjusting the attitude of a monocrystal ingot when the monocrystal ingot is clamped by a surface grinding device while preventing the application of excessively large force to the monocrystal ingot A third object of the present invention is to provide a monocrystal ingot rotating device for a surface grinding device, the monocrystal ingot rotating device being capable of making the grinding rotation center accurately coincide with the rotation center line of the rotational clamp shaft of a monocrystal ingot rotating device.

In order to achieve the above-described objects, the present invention provides a monocrystal ingot conveying/surface-grinding apparatus comprising: a plurality of monocrystal ingot surface grinding devices disposed serially; a guide means, for example, a rail, disposed along the monocrystal ingot surface grinding devices disposed serially; and monocrystal ingot conveying/attitude-adjusting device for loading/unloading the monocrystal ingot to and from the monocrystal ingot surface grinding devices, the monocrystal ingot conveying/attitude-adjusting device being arranged movable along the guide means.

The monocrystal ingot surface grinding device comprises: a pair of rotational clamp shafts having the aligned rotational center lines and disposed to confront each other; means for causing the front surfaces of the rotational clamp shafts to abut against the two end surface of the monocrystal ingot having instructed grinding rotation centers so as to support the monocrystal ingot; means for rotating the rotational clamp shafts; and means for causing a grindstone to abut against the surface of the monocrystal ingot so as to grind it to form a cylindrical shape.

The monocrystal ingot conveying/attitude-adjusting device comprises: hands for holding the monocrystal ingot; a travelling portion guided by the guide means so as to move as desired; and an intermediate portion disposed between the hands and the travelling portion and arranged to move the hands so that the grinding rotation centers of the two end surface of the monocrystal ingot held by the hands are made coincide with the rotation center line of the rotational clamp shaft of the monocrystal ingot surface grinding device.

According to this embodiment, since the monocrystal ingot conveying/attitude-adjusting device has a function of loading/unloading the monocrystal ingot to and from the monocrystal ingot surface grinding device, only one monocrystal ingot conveying/attitude-adjusting device is able to sufficiently load/unload the monocrystal ingots to and from a plurality of the monocrystal ingot surface grinding devices.

Therefore, according to this embodiment, an effect can be obtained in that the overall structure of the apparatus can be simplified and the space necessary to install the apparatus can be reduced.

The guide mean is a rail disposed, for example, above the monocrystal ingot surface grinding devices Furthermore, the monocrystal ingot conveying/attitude-adjusting device is arranged in such a manner that its travelling portion is disposed above the hands.

According to this structure, the space necessary to install the apparatus can be satisfactorily reduced.

The above-described intermediate portion of the monocrystal ingot conveying/attitude-adjusting device has an X-Y-$\theta$-$\phi$ stage having a base, an X-stage which is moved with respect to the base in a direction of an X-axis, a Y-stage which is moved in a direction of a Y-axis which is perpendicular to the X-axis, a $\theta$-stage which is rotated around an axis which parallels the X-axis and $\phi$-stage which is rotated around an axis which parallels the Y-axis.

In general, the monocrystal ingot must be held at its two portions by a pair of hands. Therefore, two X-Y stages for individually moving the two hands in a vertical plane may be provided for the intermediate portion. However, the width of the monocrystal ingot conveying/attitude-adjusting device is enlarged excessively. Furthermore, the grinding rotation center of the monocrystal ingot cannot be made accurately coincide with the rotation center line of the rotational clamp shaft. That is, two operational steps must be performed in order to make the grinding rotation center line to parallel the rotation center line of the rotational clamp shaft. Furthermore, two operational steps must be performed for the purpose of making the above-described two center lines coincide with each other. However, if the motors for respectively operating the two hands are rotated for the same time, the two center lines cannot be accurately made coincide with each other because of the difference between the stoppage accuracies of the two motors and the mechanical dimensional errors between the two hands.

However, according to the above-described structure having one X-Y-$\theta$-$\phi$ stage, the width of the monocrystal ingot conveying/attitude-adjusting device can be halved. Furthermore, the above-described two center lines can be made accurately coincide with each other due to individual four steps, for example, as shown in FIG. 12. Furthermore, the application of excessive force to the monocrystal ingot can be prevented.

The direction of each of the X-axis and Y-axis may be in a plane which is perpendicular to the direction of the rotation center line of each of clamp rotational shafts 70A and 70B of a monocrystal ingot rotating device 46. Therefore, in an ordinary case in which the direction of the rotation center line extends in a horizontal direction, the above-described X-axis extends in the horizontal direction and as well as in direction perpendicular to the direction of the above-described rotation center line, while the above-described Y-axis extends in a perpendicular direction.

The stages constituting the above-described X-Y-$\theta$-$\phi$ stage may be connected to one another in an optional order. For example, the X-stage is fastened to the base, the Y-stage is fastened to the X-stage, the $\theta$-stage is fastened to the Y-stage, the $\phi$-stage is fastened to the $\phi$-stage and the hands are fastened to the $\phi$-stage or the base.

The mechanism for operating the Y-stage with respect to the X-stage, for example, comprises: a feed screw journalled by the X-stage and having a right-hand thread and a left-hand thread formed in its single shaft; a pair of nuts respectively received by the left-hand thread and the right-hand thread; a pair of slide blocks which are moved together with the nuts and having inclined surfaces which do not run parallel to the axial direction of the feed screw; a pair of fixing blocks secured to the Y-stage in such a manner that their surfaces running parallel to the inclined surfaces are disposed to confront the inclined surfaces of the slide blocks; and means for guiding the slide blocks along the inclined surfaces of the fixing blocks, whereby the interval between the X-stage and the Y-stage is changed by rotating the feed screw.

The above-described monocrystal ingot surface grinding devices have through holes in the shaft core portions of the rotational clamp shafts, and includes cameras for outputting image signals; endoscopes the base portions of which are disposed adjacent to image lenses of the cameras, while the front portions of the same are inserted into the through holes; and means for detecting the positions of the grinding rotation centers with respect to the rotation center lines of the rotational clamp shafts in accordance with the image signals.

According to the thus constituted structure, the end surfaces of the monocrystal ingot can be observed from a direction substantially perpendicular to the surfaces. Therefore, the grinding rotation center can be made accurately coincide with the rotation center line of the rotational clamp shafts of the monocrystal ingot rotating device.

Furthermore, the above-described operation for making the two center lines coincide with each other can be automated.

The above-described endoscopes are bore scopes having light guides, wherein light sources are fastened to the base portions of the light guides and light emitted from the light sources is emitted from the front portions of the bore scopes so as to irradiate the end surfaces of the monocrystal ingot.

According to the above-described structure, the grinding rotation center can be clearly observed even if the rotational clamp shafts and the end surfaces of the monocrystal ingot are made come closer to each other. Therefore, the accuracy of the above-described coincidence established between the two center lines can be further improved.

The above-described bore scope is inserted into the above-described through hole while having, for example, a bearing fitted around the outer surface thereof.

According to the thus constituted structure, the optical axis of the bore scope and the rotation center line of the rotational clamp shaft can be made coincide with each other as a result of the above-described insertion of the bore scope. Therefore, the position of the above-described grinding rotation center with respect to the rotation center line of the rotational clamp shaft can be easily detected. Furthermore, the position at which the bore scope must be fastened can extremely easily be adjusted. If the rotational clamp shaft is mechanically vibrated or its position is undesirably deviated, the optical axis of the bore scope and the rotation center line of the rotational clamp shaft can be made always coincide with each other. Therefore, an accurate coincidence of the two center lines can be maintained for a satisfactorily long time.

The above-described monocrystal ingot conveying-/surface-grinding apparatus may further comprise: a loader, for example, a conveyer disposed below the rail and arranged to convey the monocrystal ingot which has not been ground by the monocrystal ingot surface grinding devices; and an unloader, for example, a conveyer disposed below the rail and arranged to convey the monocrystal ingot which has been ground by the monocrystal ingot surface grinding devices.

According to the above-described structure, since the two conveyers have buffer functions, a dead time can be eliminated from the operation, causing the overall working efficiency of the apparatus to be improved. That is, a further large number of monocrystal ingot surface grinding devices can be arranged to correspond to one monocrystal ingot conveying/attitude-adjusting device.

Other and further objects, features and advantages of the invention will be appear more fully from the following description.

BRIEF DESCRIPTION OF THE DRAWINGS

FIGS. 1 to 13 respectively illustrate a first embodiment of the present invention; where FIG. 1 is a perspective view which illustrates the schematic structure of a monocrystal ingot conveying-/surface-grinding apparatus;

FIG. 2 is a general flow chart which illustrates the operation performed by a monocrystal ingot conveying/attitude-adjusting device 20A;

FIG. 3 is a detailed flow chart about step 114 shown in FIG. 2;

FIGS. 4A to 4B respectively illustrate the operation of the monocrystal ingot conveying/attitude-adjusting device 20A corresponding to FIG. 3;

FIG. 5 is a perspective view which illustrates a monocrystal surface grinding device 221A;

FIG. 6 is a partial front elevational view which, in detail, illustrates the portion around the leg plate 54A shown in FIG. 5;

FIG. 7 is a partial front elevational cross sectional view which in detail illustrates the portion around the leg plate 54B shown in FIG. 5;

FIG. 8 is a schematic view which illustrates a portion for aligning a grinding central position of the monocrystal ingot conveying/surface-grinding apparatus;

FIG. 9 is a front elevational view which illustrates an X-Y-$\theta$-$\phi$ stage 24;

FIG. 10 is an enlarged cross sectional view taken along line A—A of FIG. 9;

FIG. 11 a direction in which a monocrystal ingot 10 is moved by the X-Y-$\theta$-$\phi$ stage 24;

FIG. 12 is a flow chart which illustrates the process of aligning the grinding central position performed by a controller 92;

FIG. 13 positions of images NA and NB of the grinding central points on the monitor image planes A and B corresponding to FIG. 12.

DESCRIPTION OF THE PREFERRED EMBODIMENTS

Figure 1:
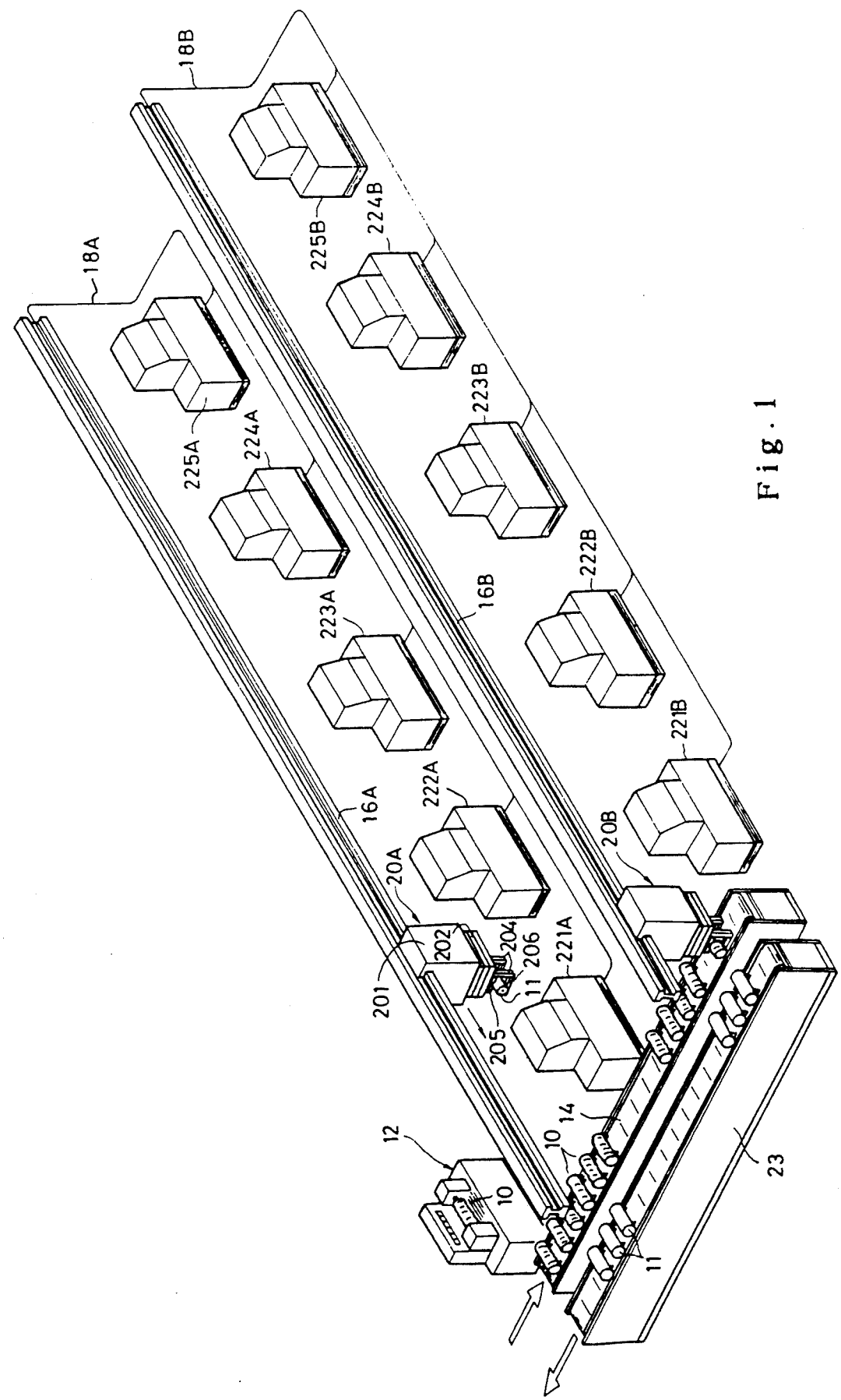

Preferred embodiments of the present invention will now be described with reference to the drawings. (1) First Embodiment FIG. 1 illustrates a monocrystal ingot conveying/surface-grinding apparatus.

Each of monocrystal ingots 10 to be processed is in the form of a substantially cylindrical shape since its two end portions are axially cut off. The thus formed monocrystal ingot 10 is loaded into a rotational-center marker 12 by a conveying robot (omitted from illustration). The rotational-center marker 12 detects the outer shape of the monocrystal ingot 10 by measuring a plurality of positions of the surface of the monocrystal ingot 10. As a result, the rotational-center marker 12 calculates the center line of rotation of the monocrystal ingot 10 to be ground, the center line enabling the monocrystal ingot 10 to be in the form of a cylindrical shape having the maximum diameter. Then, grinding center points MA and MB (omitted from illustration) are marked at intersections between the above-described center line and the two end surfaces of the monocrystal ingot 10 The monocrystal ingots 10 are, by the above-described conveying robot, placed on supporting frames 142 (see FIG. 4A) fastened to the upper surface of a conveyer belt 141 of a conveyer 14 at predetermined intervals.

Travelling rails 16A and 16B having the same shape are disposed adjacent to the ceiling of the factory in such a manner that they run parallel each other in a direction perpendicular to the conveyer 14. The travelling rails 16A and 16B respectively have monocrystal ingot conveying/attitude-adjusting devices 20A and 20B fastened so as to be capable of moving along the travelling rails 16A and 16B.

On the other hand, monocrystal ingot surface grinding devices 221A to 225A and 221B to 225B of the same structure are, at the same intervals on the floor of the factory, disposed in series along the travelling rails 16A and 16B.

The monocrystal ingot conveying/attitude-adjusting device 20A and the monocrystal ingot surface grinding devices 221A to 225A are able to communicate with each other via a communication cable 18A. Similarly, the monocrystal ingot conveying/attitude-adjusting device 20B and the monocrystal ingot surface grinding devices 221B to 225B are able to communicate with each other via a communication cable 18B. The communication cable 18A and the monocrystal ingot conveying/attitude-adjusting device 20A are magnetically connected to each other in a non-contact manner. Similarly, the communication cable 18B and the monocrystal ingot conveying/attitude-adjusting device 20B are magnetically connected to each other in a non-contact manner.

Since the operation of the monocrystal ingot conveying/attitude-adjusting device 20A and that of the monocrystal ingot conveying/attitude-adjusting device 20B are the same, the description will be made about only the monocrystal ingot conveying/attitude-adjusting device 20A.

The monocrystal ingot conveying/attitude-adjusting device 20A conveys the monocrystal ingots 10 placed on the conveyer 14 so as to supply them to the monocrystal ingot surface grinding devices 221A to 225A. Furthermore, the monocrystal ingot conveying/attitude-adjusting device 20A places the monocrystal ingots 11 which have been ground to form cylindrical shapes by the monocrystal ingot surface grinding devices 221A to 225A on the conveyer 23 disposed in parallel to the conveyer 14.

Figure 2:
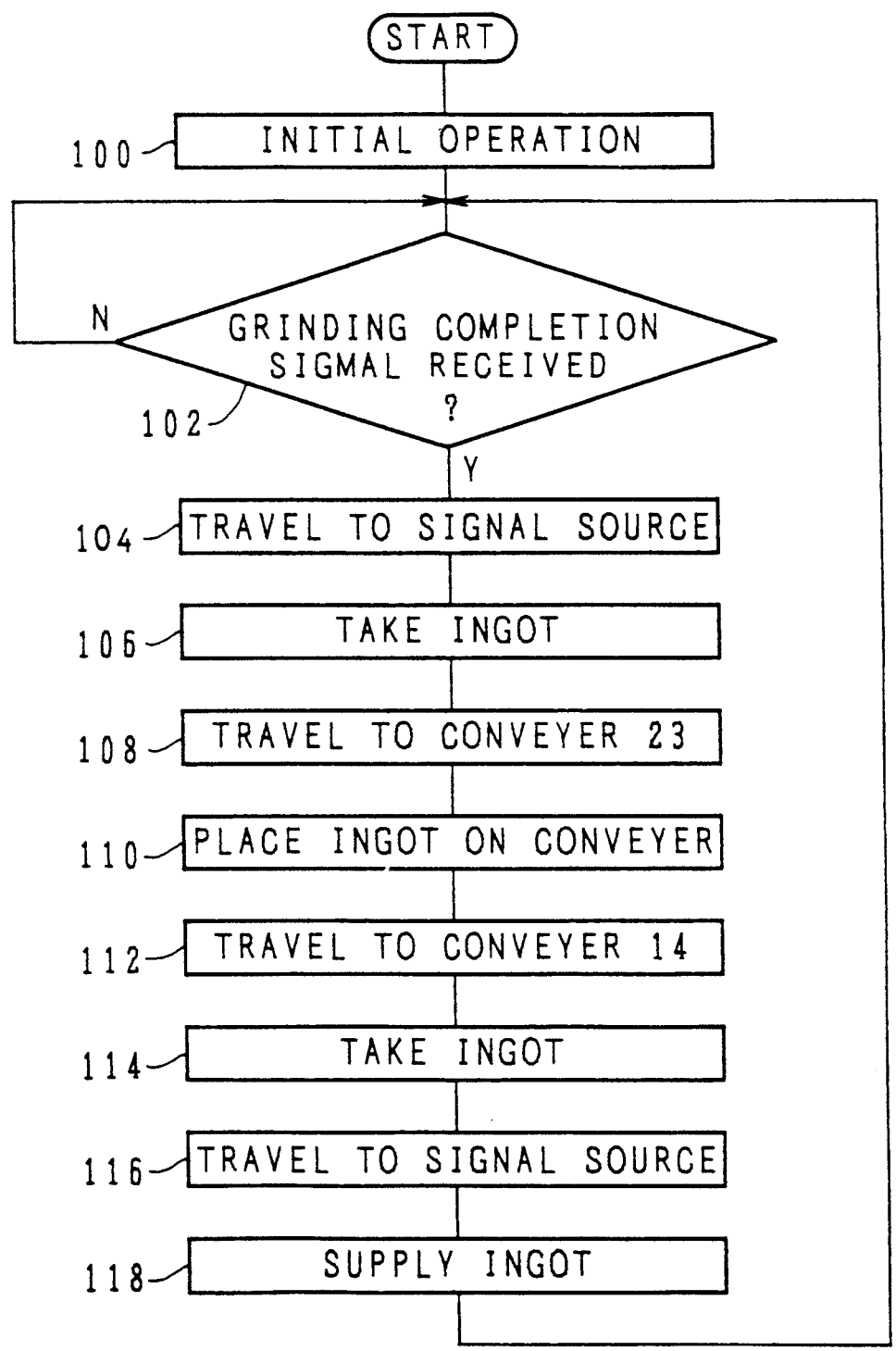

FIG. 2 illustrates a sequence of the conveying operation performed by the monocrystal ingot conveying/attitude-adjusting device 20A (100) At first the monocrystal ingot surface grinding devices 221A to 225A have no subject to be ground. Therefore, the monocrystal ingot conveying/attitude-adjusting device 20A conveys the monocrystal ingots 10 placed on the conveyer 14 so as to supply them to the above-described monocrystal ingot surface grinding devices 221A to 225A.

(102) When any of the monocrystal ingot surface grinding devices 22iA (i=1 to 5) completes the grinding work and transmits a signal which denotes the completion of the grinding work, the monocrystal ingot conveying/attitude-adjusting device 20A receives the above-described signal. Then, the flow advances to next step 104.

(104) The monocrystal ingot conveying/attitude-adjusting device 20A is moved to a position above the monocrystal ingot surface grinding device 22iA which has transmitted the signal which denotes the completion of the grinding work.

(106) Subsequently, the monocrystal ingot conveying/attitude-adjusting device 20A holds the cylindrical monocrystal ingot 11 which has been held by the monocrystal ingot surface grinding device 22iA so that the cylindrical monocrystal ingot 11 is sent from the monocrystal ingot surface grinding device 22iA.

(108) The monocrystal ingot conveying/attitude-adjusting device 20A is moved to the conveyer 23 in a state shown in FIG. 1.

(110) The monocrystal ingot conveying/attitude-adjusting device 20A places the cylindrical monocrystal ingot 11, which has been held by it, on the conveyer 23.

(112) The monocrystal ingot conveying/attitude-adjusting device 20A is subsequently moved to a position above the conveyer 14.

(114) The monocrystal ingot conveying/attitude-adjusting device 20A holds and lifts the monocrystal ingot 10 placed on the conveyer 14.

(116) The monocrystal ingot conveying/attitude-adjusting device 20A is moved to a position above the monocrystal ingot surface grinding device 22iA which has transmitted the signal which denotes the completion of the grinding work.

(118) The monocrystal ingot conveying/attitude-adjusting device 20A downwards moves the monocrystal ingot 10 so as to supply it to the monocrystal ingot surface grinding device 22iA.

As a result, the monocrystal ingot surface grinding device 22iA holds the monocrystal ingot 10 so that the surface of the monocrystal ingot 10 is ground to form a cylindrical shape.

Then, the schematic structure of the monocrystal ingot conveying/attitude-adjusting device 20A will now be described with reference to FIG. 4A. The monocrystal ingot conveying/attitude-adjusting device 20A comprises the following elements 201 to 206.

A travelling portion 201 is fastened to the travelling rail 16A in such a manner that it can be moved in the lengthwise direction of the travelling rail 16A by a motor M1. The travelling portion 201 further moves, by a motor M2 thereof, upwards/downwards a vertical arm 203 having the lower end portion to which the upper end portion of an attitude adjusting portion 202 is secured. The vertical arm 203 and the travelling portion 201 are connected to each other by, for example, a rack and pinion.

The attitude adjusting portion 202 has two wrists 204 secured to the lower end portion of the same in such a manner that the two wrists 204 are disposed in parallel in the vertical direction of the drawing sheet (see FIG. 1). The wrists 204 respectively comprise hands 205 and 206 having the same structure, the hands 205 and 206 being respectively operated vertically in the opposite directions to each other by the same distance by corresponding motors M3 provided for the wrists 204. For example, a feed screw having a right-hand thread in the upper portion thereof and a left-hand thread in the lower portion thereof is rotated by the torque motor M3 so that the hands 205 and 206 are respectively vertically moved via nuts respectively received by the upper portion and the lower portion of the feed screw. The reason why the torque motors M3 are provided for the corresponding wrists 204 is that the monocrystal ingot 10 has different diameters depending upon its portions.

The attitude adjusting portion 202 has four motors mounted for the purpose of operating an X-Y-$\theta$-$\phi$ stage 24 (see FIG. 9) to be described later.

Then, the above-described step 114 will now be described in detail with reference to FIGS. 3 and 4A to 4G.

Figure 4A:
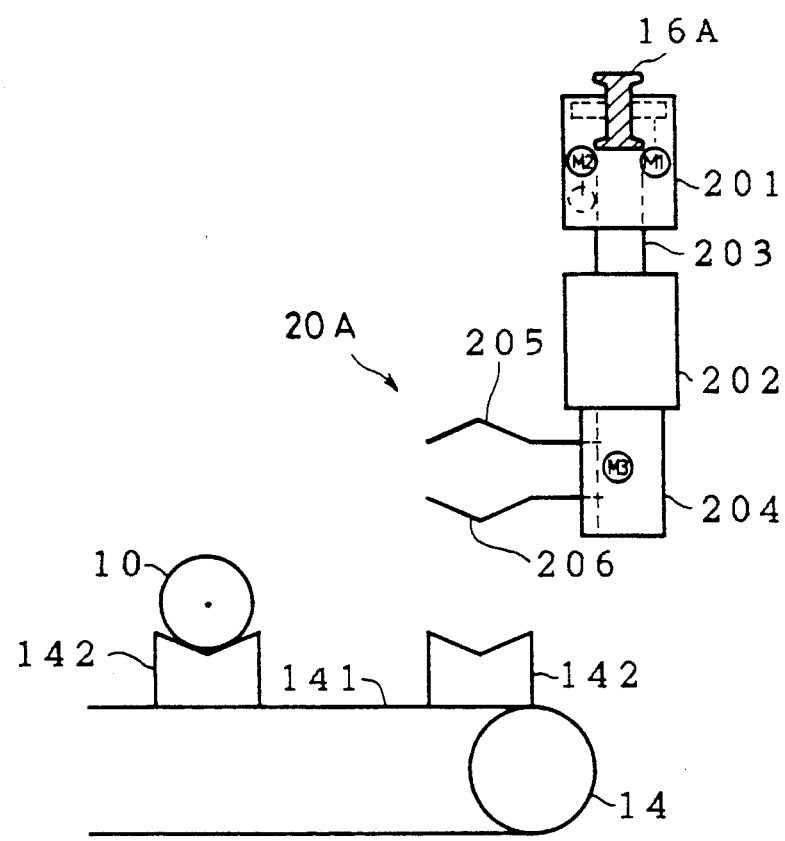

First, the monocrystal ingot conveying/attitude-adjusting device 20A is, as shown in FIG. 4A, positioned in such a manner that its attitude adjusting portion 202 is positioned adjacently to the travelling portion 201 (the uppermost position). Furthermore, the two hands 205 and 206 are positioned farthest away from each other (200) In this state, the travelling portion 201 downwards moves the attitude adjusting portion 202 to the level at which the monocrystal ingot 10 placed on the conveyer 14 is positioned before the attitude adjusting portion 202 is subsequently stopped as shown in FIG. 4B.

(202) The conveyer belt 141 is operated forward by one step (by the distance between the monocrystal ingots 10 placed on the conveyer 14). As a result, the monocrystal ingot 10 is positioned between the hands 205 and 206 as shown in FIG. 4C.

Figures 4D, 4E:
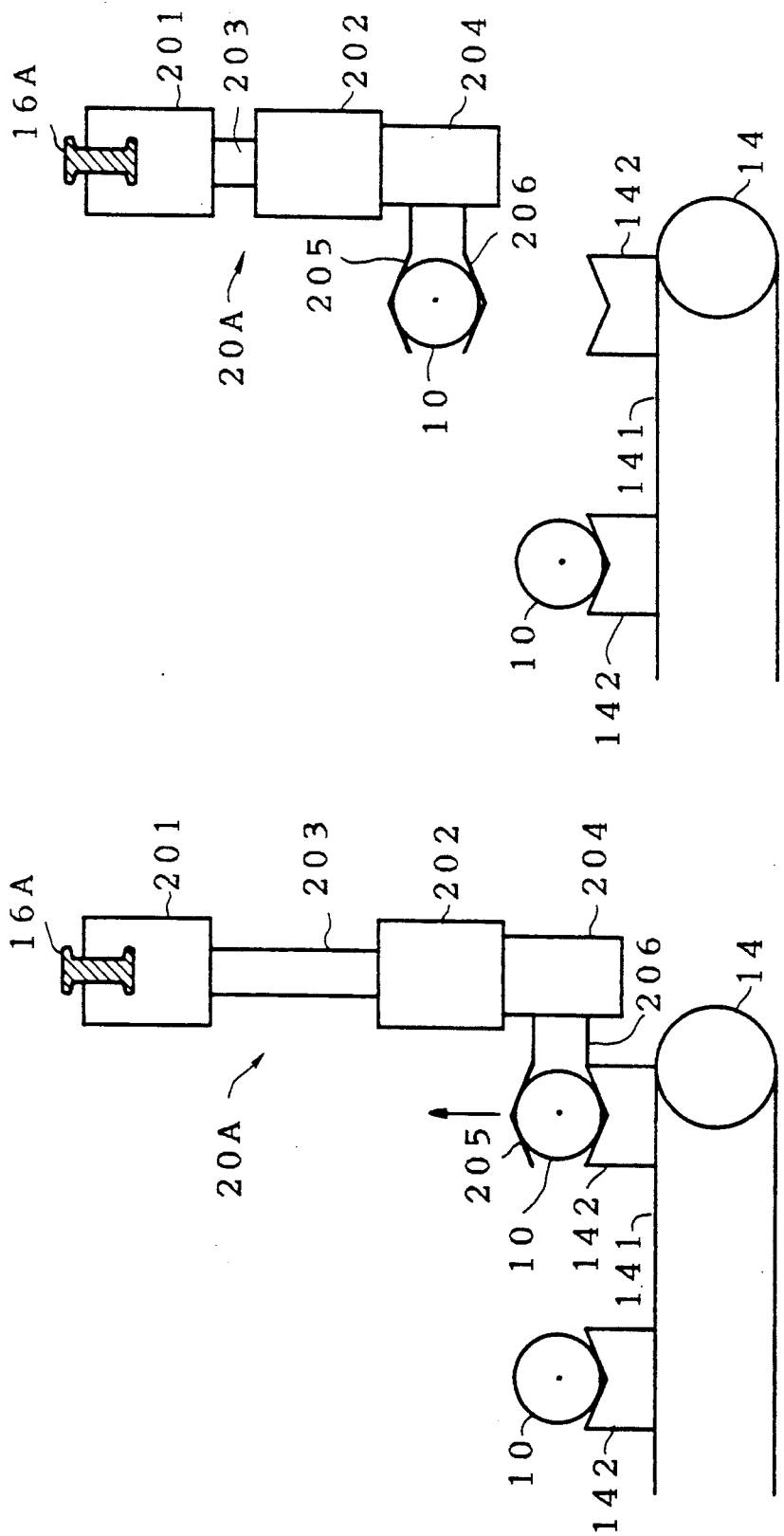

(204) The torque motor M3 of the wrist 204 is turned on so as to move the hands 205 and 206 in a direction in which they approach each other, causing a state shown in FIG. 4D to be realized. The rotation of the torque motor M3 is maintained as it is.

(206) The travelling portion 201 upwards moves the attitude adjusting portion 202 to its uppermost position before it is stopped in a state shown in FIG. 4E.

As described above, the operations in step 114 shown in FIG. 2 are performed.

Figure 3:
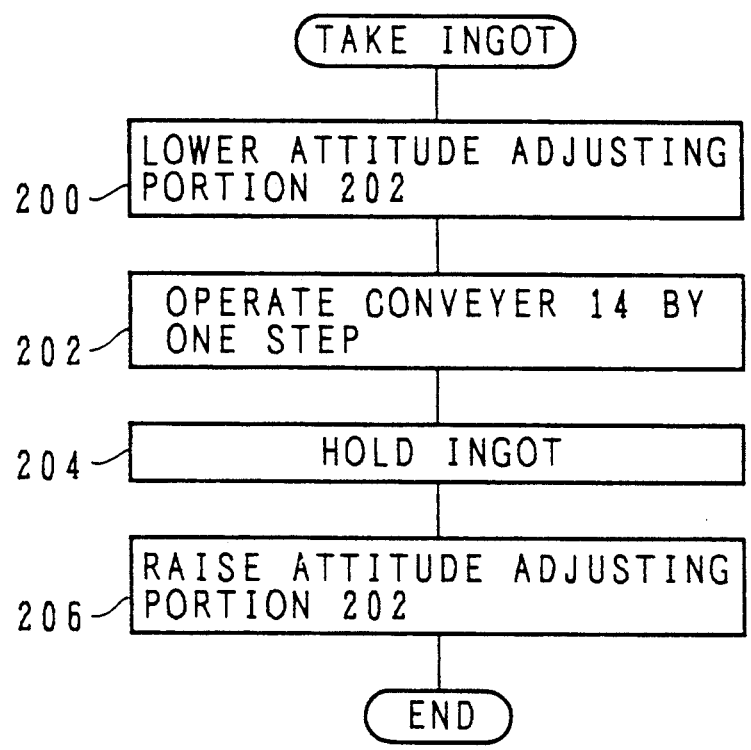

The operations in step 110 shown in FIG. 2 are retroactively performed in a direction from step 206 to step 200 shown in FIG. 3.

Then, the monocrystal ingot surface grinding device 221A shown in FIG. 1 will now be described with reference to FIGS. 5 to 7.

The mechanical structure of the monocrystal ingot surface grinding device 221A is constituted by a monocrystal ingot rotating device 46 and a grindstone moving device 48. The grindstone moving device 48 moves its grindstone 49 in all directions with respect to the monocrystal ingot 10 which is being rotated while being held by the monocrystal ingot rotating device 46. Since the grindstone moving device 48 is constituted in a known manner, description about is omitted here. Then, the monocrystal ingot rotating device 46 will now be described.

A base plate 52 secured to a base frame 50 has a leg plate 54A and two parallel rails 56 respectively secured thereto. A slider 58 is received by the two rails 56 in such a manner that the slider 58 is able to move on the rails 56 in a direction perpendicular to the leg plate 54A. A leg plate 54B confronting the leg plate 54A is secured to the top surface of the slider 58. A hydraulic cylinder 60 is secured to the upper surface of the leg plate 54B in such a manner that a piston rod 62 of the hydraulic cylinder 60 parallels the rails 56. The front portion of the piston rod 62 is secured to a stopper 64. Furthermore, a slider 65 is secured to the lower surface of the stopper 64, the slider 65 being received by the rail 56. The stopper 64 is secured to the rail 56 at an optional position in the lengthwise direction of the rail 56 by a screw 66 which is inserted into the stopper 64.

Figure 6:
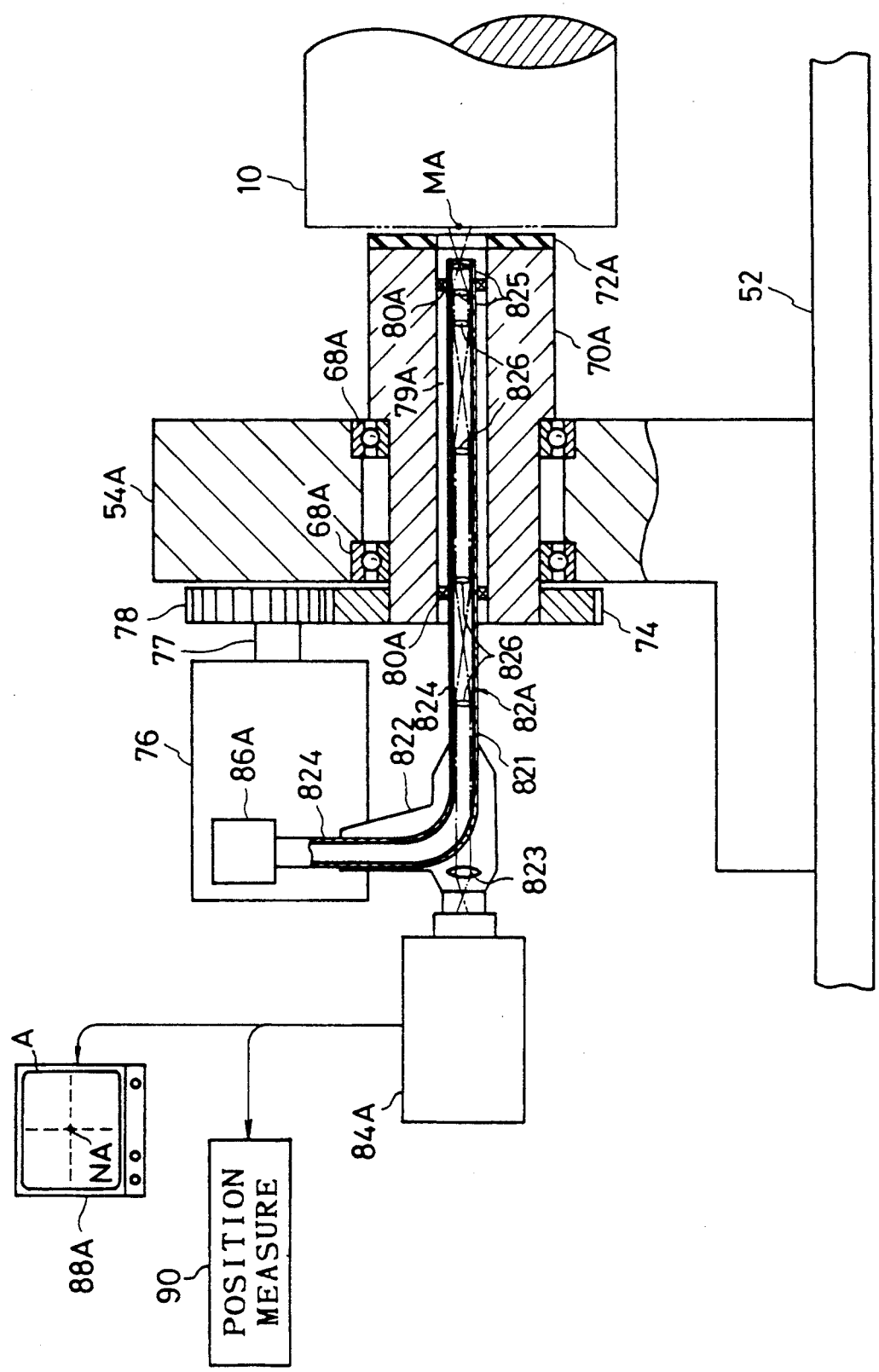

As shown in FIG. 6, bearings 68A are secured to the two end portions of a through hole formed in the leg plate 54A. A rotational clamp shaft 70A is received by the above-described bearings 68A. An annular rubber plate 72A is pasted to the front surface of the rotational clamp shaft 70A. A spur gear 74 is secured to the base portion of the rotational clamp shaft 70A, the base portion of the rotational clamp shaft 70A projecting over the leg plate 54A. On the other hand, a motor 76 is secured to the leg plate 54A via a bracket (omitted from illustration), the motor 76 having a motor shaft 77 to which a spur gear 78, which is arranged to be engaged with the spur gear 74, is secured.

Therefore, when the motor 76 is turned on, the rotational clamp shaft 70A is rotated. The rotational clamp shaft 70A has, in the shaft core portion thereof, a through hole 79A formed concentrically with the rotational clamp shaft 70A. The front portion of a bore scope 82A, to which a bearing 80A is fastened around the outer surface thereof, is inserted into the through hole 79A so as to be supported by the through hole 79A. The bore scope 82A is arranged in such a manner that the base portion of a hard pipe 821 is fastened to a base portion 822. Furthermore, a CCD camera 84A is secured to the base portion 822 to confront an ocular lens 823 disposed in the base portion 822. The base portion 822 is supported by the lower leg plate 54A via a bracket (omitted from illustration). A light source 86A is secured to the base end portion of the pipe 821. Irradiating light emitted from the light source 86A passes through a light guide (an optical fiber) 824 disposed inside the pipe 821 so as to be emitted outside through the front portion of the bore scope 82A so as to irradiate the end surface of the monocrystal ingot 10. Light reflected from the end surface of the monocrystal ingot 10 passes through an objective lens 825 and a relay lens 826 respectively disposed in the pipe 821. Reflected light further passes through the ocular lens 823 before it is imaged on an image sensor (omitted from illustration) included in the CCD camera 84A. An image signal taken from the CCD camera 84A is supplied to a confirmation monitor TV 88A.

Therefore, an image plane A of the monitor TV 88A displays an image NA of the central point to be ground, the image NA corresponding to the grinding central point MA marked on the end surface of the monocrystal ingot 10. The monitor TV 88A also displays an XY rectangular coordinate the intersection of which corresponds to the optical axis of the bore scope 82A and the rotation center line of the rotational clamp shaft 70A.

Figure 7:
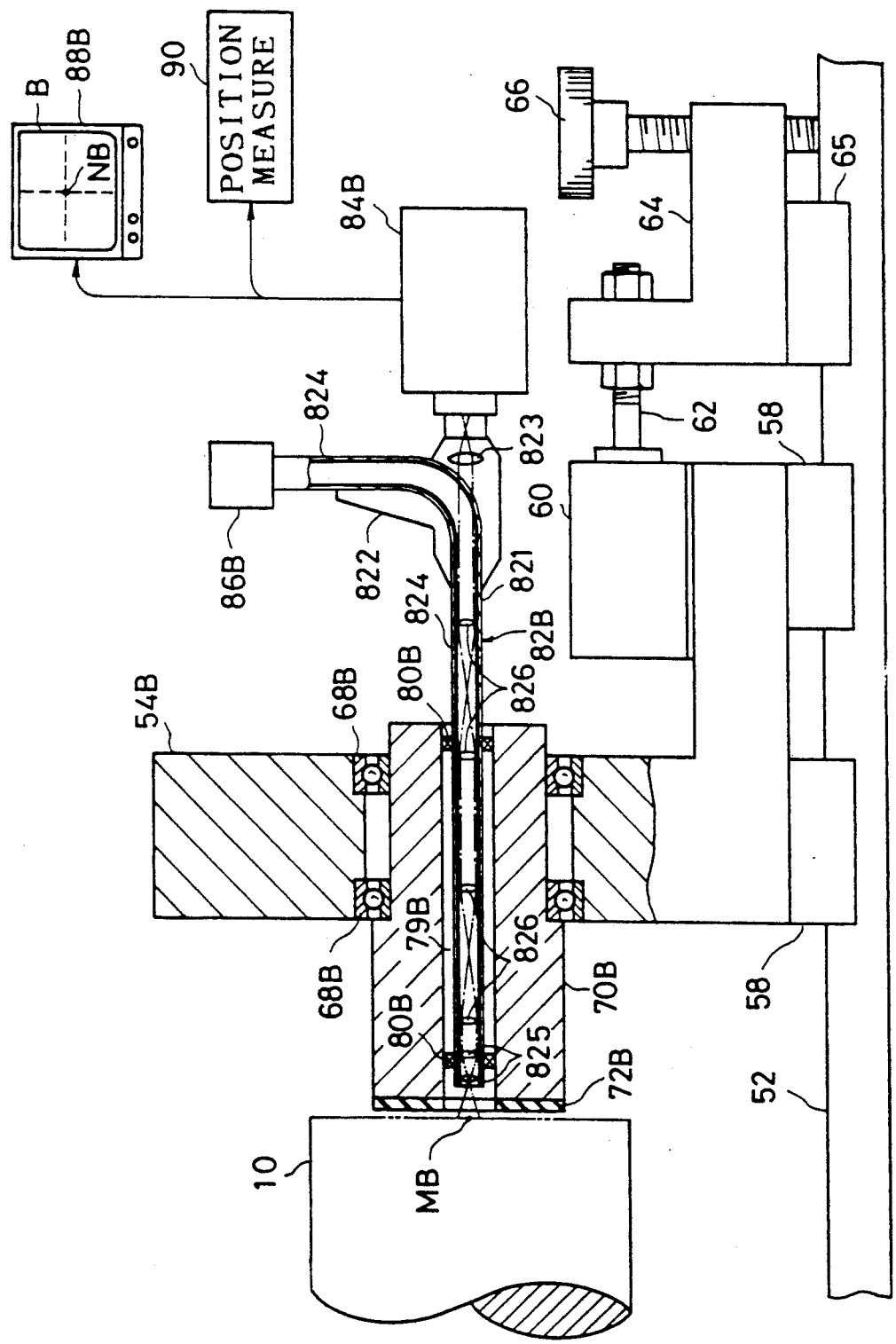

FIG. 7 illustrates the structure of a portion adjacent to the leg plate 54B. The structure of this portion is the same as that shown in FIG. 6 except for an arrangement in which the rotational clamp shaft 70B freely rotates. Therefore, the same elements are given the same reference numerals and symbol A is replaced by symbol B, the description of the same elements being omitted here.

Figure 5:
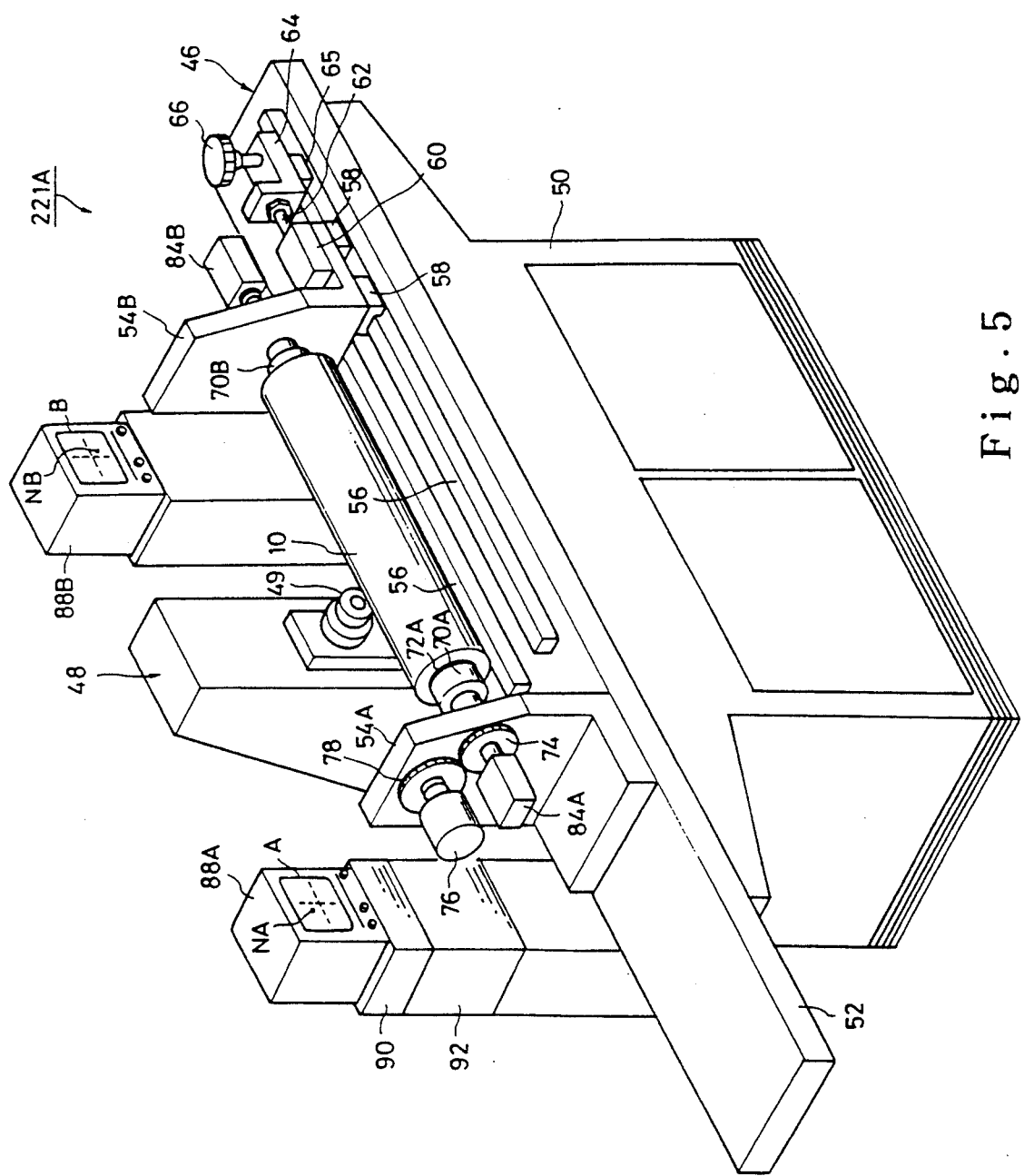

Referring to FIG. 5, since grinding dust and cooling liquid fly at the time of the grinding operation, a slide cover (omitted from illustration) which covers the upper portion and the front portion between the leg plates 54A and 54B is disposed in such a manner that it is able to slide in the lengthwise direction of the base plate 52. Furthermore, a slide sheet (omitted from illustration), through which a grindstone 49 is inserted, is provided for the grindstone moving device 48 in such a manner that the slide sheet covers the backside between the leg plates 54A and 54B, the slide sheet being able to move together with the grindstone 49.

Figure 8:
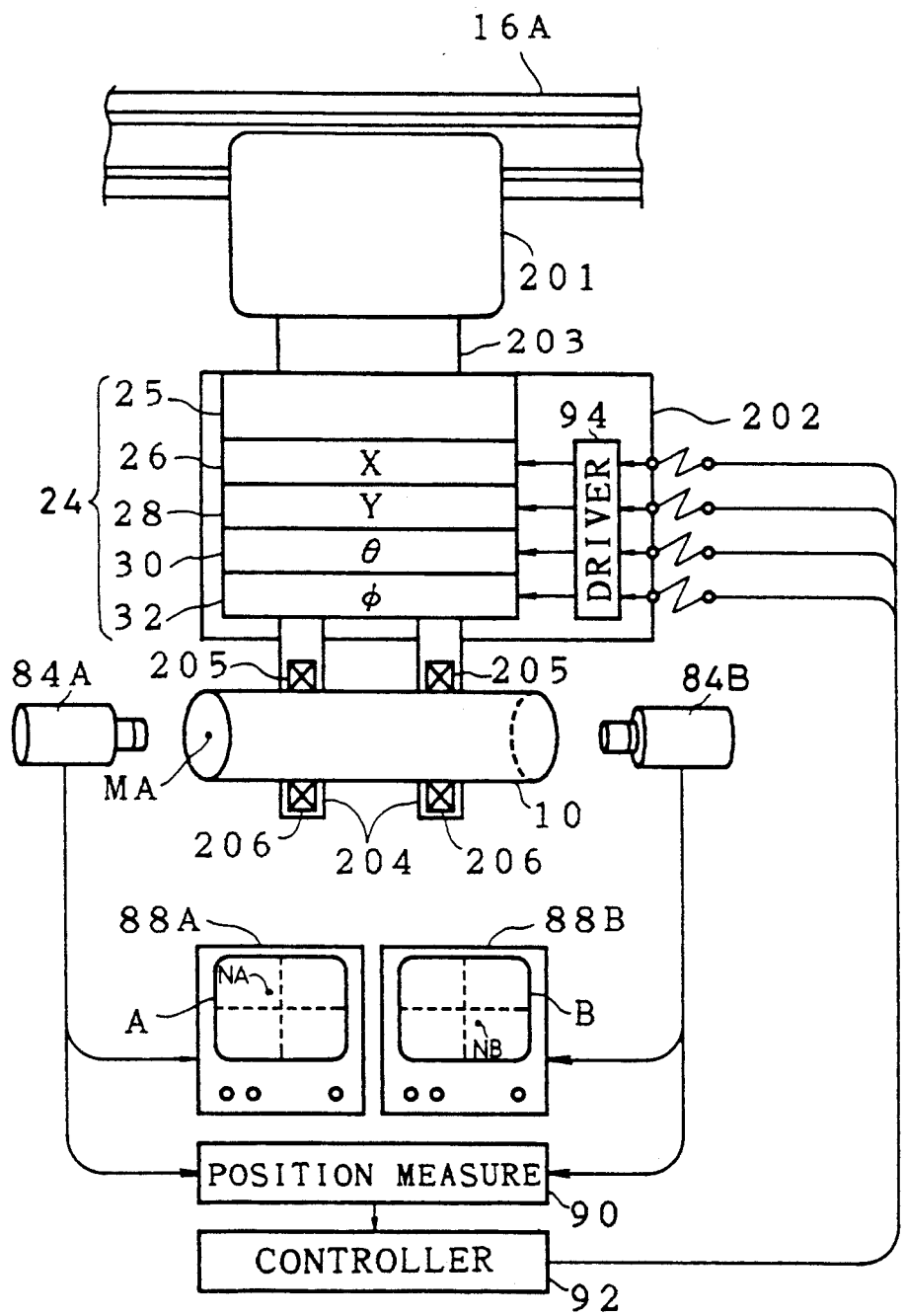

As shown in FIG. 8, image signals transmitted from the CCD cameras 84A and 84B are also supplied to a position measuring device 90. The position measuring device 90 calculates deviated coordinates ($\Delta X_A$, $\Delta Y_A$) and ($\Delta X_B$, $\Delta Y_B$) of the grinding central points MA and MB from the optical axes of the CCD cameras 84A and 84B so as to supply the result of the calculation to a controller 92. FIG. 13A illustrates the coordinate of each of the images NA and NB of the grinding central points. The controller 92 operates an X-stage 26, a Y-stage 28, a $\theta$-Stage 30 and $\theta$-stage 32 of the X-Y-$\theta$-$\phi$ stage 24 via a driver 94 provided for the attitude adjusting portion 202. As a result, the above-described deviated coordinates are made coincide with the origin (0, 0). The driver 94 and the controller 92 are optically or magnetically connected to each other in a non-contact manner.

Then, the structure of the X-Y-$\theta$-$\phi$ stage 24 will now be described with reference to FIGS. 9 and 10. FIG. 10 is an enlarged cross sectional view taken along line A—A of FIG. 9.

Rails 251 are secured to the two end portions of the lower surface of the base 25, the rails 251 being disposed in a direction perpendicular to the drawings sheet. A feed screw 252 is received in a direction perpendicular to the drawing sheet by a bearing (omitted from illustration) at the central portion of the lower surface of the base 25 in such a manner the feed screw 252 is rotated by a motor M5. On the other hand, a slider 261 which receives the rails 251 is secured to the upper surface of the X-stage 26. Furthermore, a nut 262 which receives the above-described feed screw 252 is secured to the central portion of the upper surface of the X-stage 26.

Figure 9:
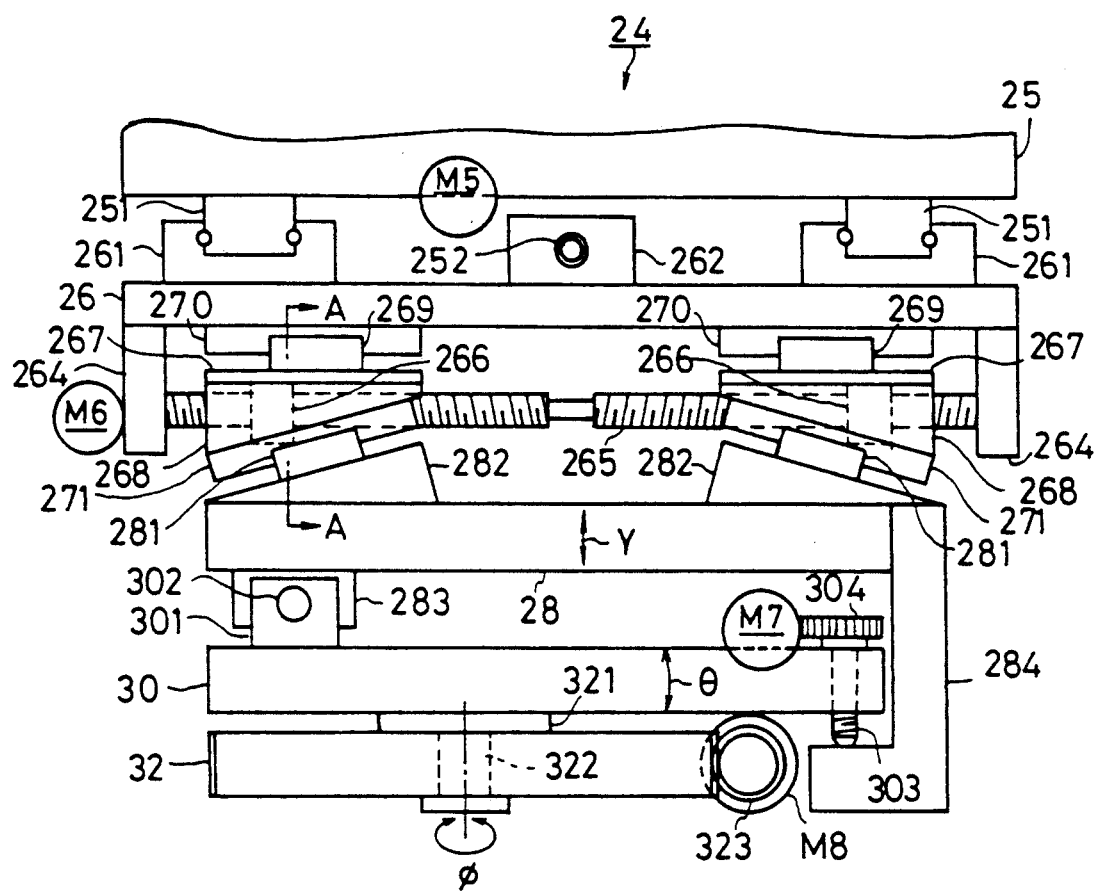
Figure 10:
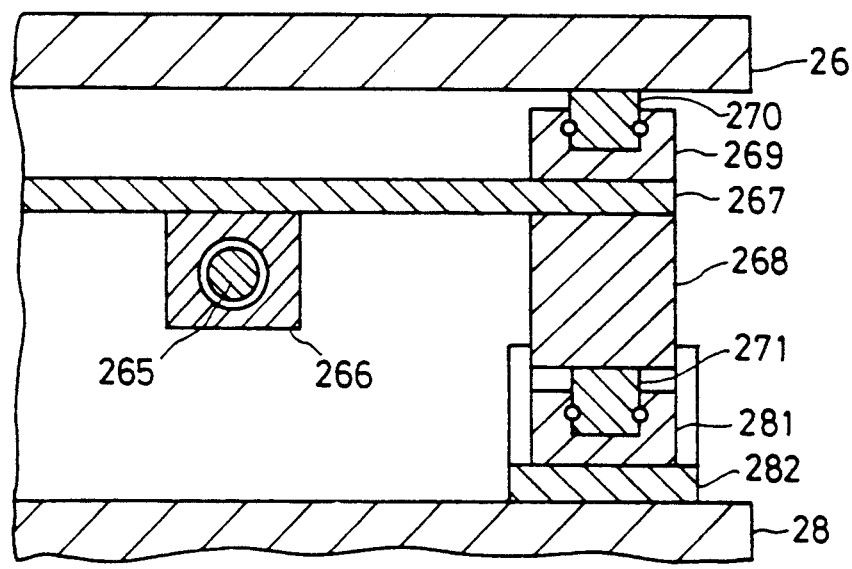

Therefore, when the motor M5 is rotated, the X-stage moves with respect to the base 25 in a direction perpendicular to the drawing sheet of FIG. 9.

Leg plates 264 are secured to the two end portions of the lower surface of the X-stage 26 to confront each other. Furthermore, a feed screw 265 is rotatably supported by the leg plates 264, the feed screw 265 having a right-hand thread and a left-hand thread formed symmetrically with each other similarly to the portion for operating the hands 205 and 206. Nuts 266 are received by the above-described threads. The feed screw 265 is rotated by a motor M6 secured to the leg plate 264. Each of the nuts 266 is secured to the central portion of the lower surface of the slide plate 267. Sliders 269 are secured to the end portions of the upper surfaces of the slide plates 267, the sliders 269 being received by rails 270 which are secured to the lower surface of the X-stage 26 in a lateral direction of FIG. 9. Taper blocks 268 are secured to the end portions of the lower surfaces of the slide plates 267. A rail 271 is secured to the lower surface (inclined surface) of each of the taper blocks 268, the rail 271 being received by a guide 281 of the same shape as that of the above-described slider 269. The guides 281 are secured to the two end portions of the upper surface of the Y-stage 28 via taper blocks 282.

As a result, when the motor M6 is rotated, the taper blocks 268 respectively are moved in the opposite lateral directions. Furthermore, the Y-stage 28 is simultaneously vertically moved in a direction designated by an arrow Y with respect to the X-stage 26.

A connecting piece 283 is secured to an end portion of the lower surface of the Y-stage 28, while another connecting piece 301 is secured to an end portion of the upper surface of the θ-stage 30. Furthermore, a pin 302 is inserted into the above-described connecting pieces 283 and 301. A feed screw 303 is inserted into another end portion of the θ-stage 30. Furthermore, a spur gear 304 fastened to the base portion of the feed screw 303 is rotated by a motor M7 secured to the θ-stage 30. The front portion of the feed screw 303 pushes the horizontal portion of an L-shape piece 284 secured to the side surface of the Y-stage 28.

Therefore, when the motor M7 is rotated, the θ-stage 30 is rotated around the pin 302 with respect to the Y-stage 28 in a direction designated by an arrow θ.

A φ-stage 32, which is a worm wheel, is rotatably received onto the lower surface of the θ-stage 30 by a pin 322 via a spacer 321. A worm 323 received by a bearing (omitted from illustration) is engaged with the φ-stage 32, the worm 323 being rotated by a motor M8 secured to the θ-stage 30.

Therefore, when the motor M8 is rotated, the φ-stage 2 is rotated around the pin 322 relative to the θ-stage 30 in a direction designated by an arrow θ.

The wrist 204 shown in FIG. 4A is, although omitted from illustration, secured to the θ-stage 32.

Figure 11:
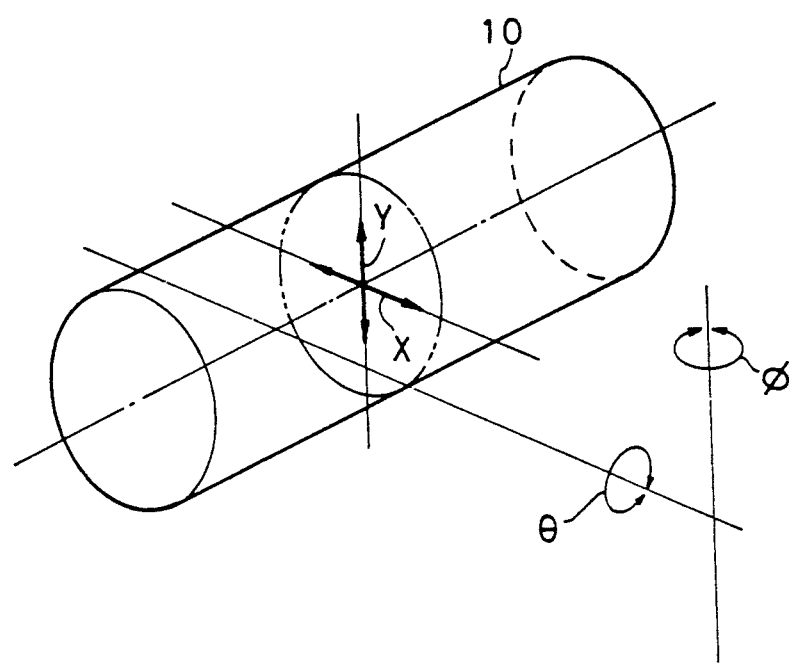

FIG. 11 illustrates the direction in which the monocrystal ingot 10 is moved by the X-Y-θ-φ stage 24 by arrows X, Y, θ and φ. The center of rotation θ parallels the X-axis, while that of rotation φ parallels the Y-axis.

Figure 12:
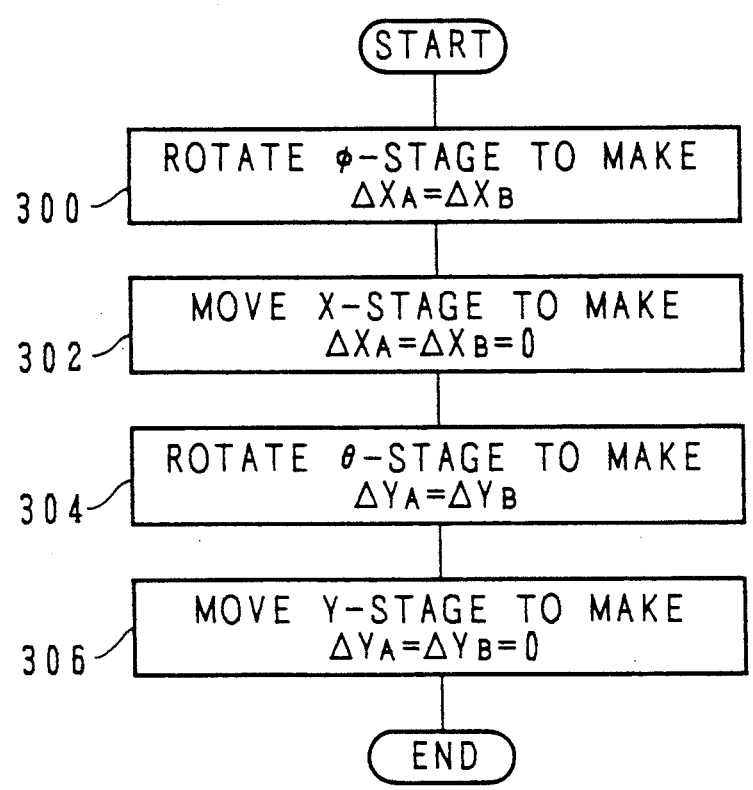

Then, an attitude adjusting operation, which is performed by the X-Y-θ-φ stage 24 in a state where the attitude adjusting portion 202 has been downwards moved, will be described with reference to FIGS. 12 and 13. First, the images NA and NB of the grinding central points are as shown in FIG. 13.

(300) In this state, the φ-stage 32 is rotated in such a manner that an equation $\Delta X_A = \Delta X_B$ is held as shown in FIG. 13B.

(302) Subsequently, the X-stage 26 is moved in such a manner that an equation $\Delta X_A = \Delta X_B = 0$ is held as shown in FIG. 13C.

(304) Subsequently, the θ-stage 30 is rotated in such a manner that an equation $\Delta Y_A = \Delta Y_B$ is held as shown in FIG. 13D.

(306) Subsequently, the Y-stage 28 is moved in such a manner that an equation $\Delta Y_A = \Delta Y_B$ is held as shown in FIG. 13E.

As a result, the grinding central points MA and MB are made accurately coincide with the rotational central lines of the rotational clamp shafts 70A and 70B.

In this state, the hydraulic cylinder 60 is turned on so that the monocrystal ingot 10 is held between the rotational clamp shafts 70A and 70B. Furthermore, the motor 76 is rotated so that the monocrystal ingot 10 is rotated. Thus, the surface of the monocrystal ingot 10 is ground by the grindstone moving device 48. As a result, the cylindrical monocrystal ingot 11 having almost the maximum diameter can be obtained.

(2) Second Embodiment

Figure 14:
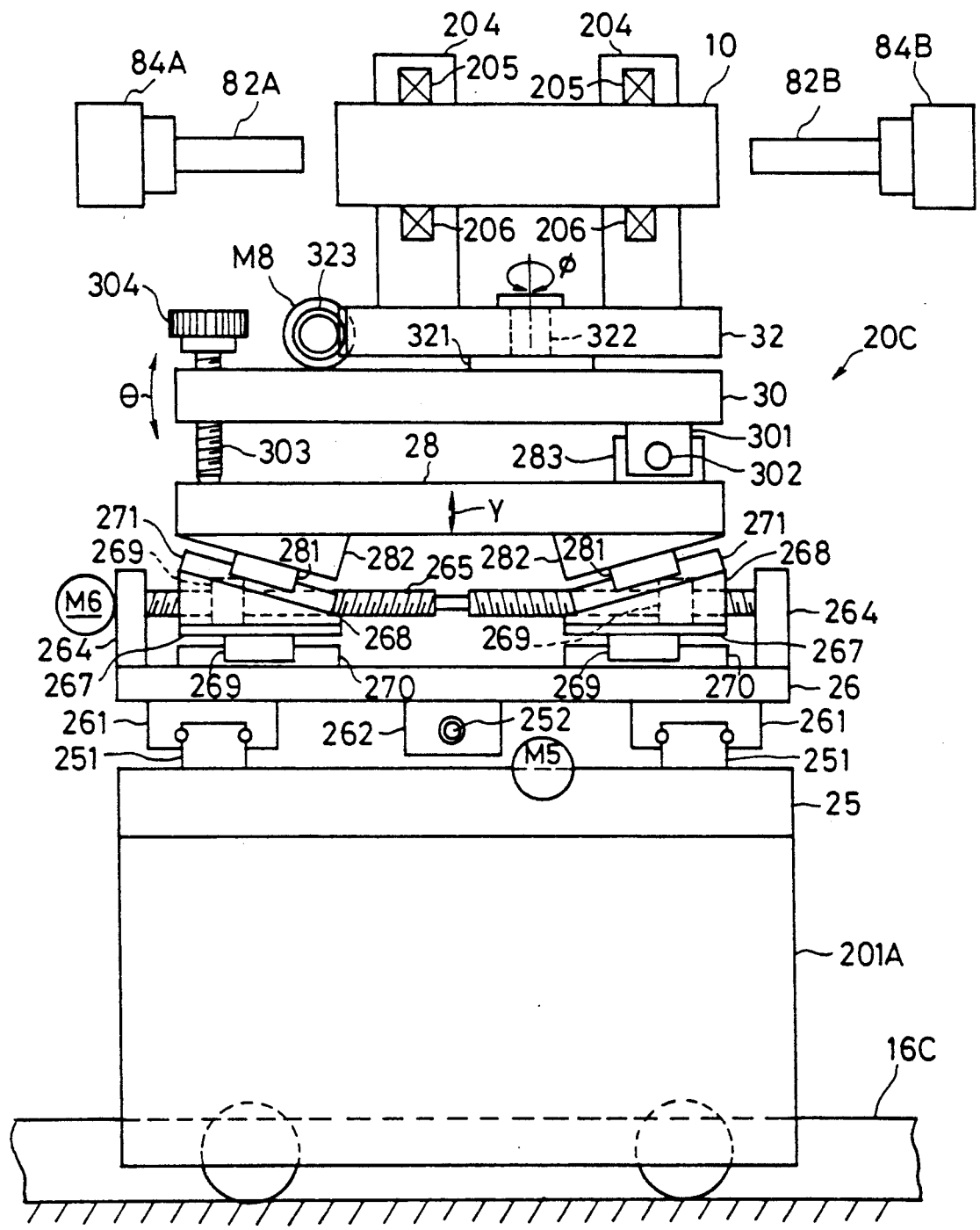
FIG. 14 is a front elevational view which illustrates a second embodiment of a monocrystal ingot conveying-/attitude-adjusting device according to the present invention.

FIG. 14 illustrates a monocrystal ingot conveying/attitude-adjusting device 20C according to the second embodiment of the present invention.

The monocrystal ingot conveying/attitude-adjusting device 20C is arranged in such a manner that its conveying portion 201A moves along a rail 16C arranged on the floor or a factory. An X-Y-θ-φ stage 24A, which is constituted by substantially vertically inverting the X-Y-θ-φ stage 24 shown in FIG. 9, is disposed on the base plate 25 of the conveying portion 201A. The same elements are given the same reference numerals, and their descriptions are omitted here. A wrist 204, which is the same as that shown in FIG. 4A, is secured to the upper surface of the φ-stage 32. The hands 206 and 207, which are the same as those shown in FIG. 4A, project over the front surface of the wrist 204 in a direction upwards perpendicular to the drawing sheet.

The monocrystal ingot conveying/attitude-adjusting device 20C is arranged in such a manner that the function of the vertical arm 203 shown in FIG. 4A is replaced by the Y-stage 28.

The other arrangements are the same as those according to the first embodiment.

A variety of modifications are included in the scope of the present invention.

For example, a structure may be employed which is arranged in such a manner that a U or 0-shape rail is employed in place of the rails 16A and 16B and thereby the range, in which the monocrystal ingot conveying-/attitude-adjusting devices 20A and 20B are able to move, is enlarged. In this case, the efficiency of the operation of the monocrystal ingot conveying/attitude-adjusting devices 20A and 20B can further be improved.

The guide means may be replaced by a light reflecting paint line drawn on the floor of the factory. In this case, the monocrystal ingot conveying/attitude-adjusting device is arranged in such a manner that its lower portion is in the form of a car. Thus, the monocrystal ingot conveying/attitude-adjusting device moves along the above-described line while detecting the line by a reflection type photo-detector.

Furthermore, elements having the same structures as those of the rail 16A and the monocrystal ingot conveying/attitude-adjusting device 20A may be disposed between the rotational center marker 12 and the conveyer 14.

In addition, the conveyer 14 serving as a loader and a conveyer 23 serving as an unloader may be replaced by cassettes, which are disposed at predetermined intervals in the vertical direction for the purpose of placing/accommodating the monocrystal ingots, and a lifter for moving upwards/downwards the cassettes.

According to the above-described embodiments, a structure, in which a bore scope 82A is employed to serve as an endoscope, is described. However, another structure may be employed because the front portion of the endoscope must be inserted into the through hole 79A. For example, a structure may be employed which is arranged in such a manner that the base portion of a metal pipe is inserted into the through hole 79A, the base portion of the metal pipe is secured to the leg plate 54A and the front portion of a flexible endoscope is inserted into the metal pipe.

Furthermore, the necessity of making the optical axis of the bore scope 82A and the rotation center line of the rotational clamp shaft 70A coincide with each other may be eliminated. The reason for this is that the same result can be obtained by shifting the XY rectangular coordinate axes to be displayed on the monitor TV 88A.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A monocrystal ingot conveying/surface-grinding apparatus having a pair of rotational clamp shafts (70A, 70B) having aligned rotational centers and disposed to confront each other, means (54A, 54B, 58 to 64) for supporting a monocrystal ingot (10) by causing the front surfaces of said rotational clamp shafts to press the two end surfaces of said monocrystal ingot which respectively have instructed grinding rotation centers (MA, MB), means (68A, 68B, 74-78) for rotating said rotational clamp shafts and means (48) for grinding said monocrystal ingot into a cylindrical shape by abutting a grindstone against the surface of the monocrystal ingot, said monocrystal ingot conveying/surface-grinding apparatus comprising:

a plurality of monocrystal ingot surface-grinding devices (221A to 225A) disposed serially;

a rail (16A) disposed above and along said monocrystal ingot surface-grinding devices disposed serially; and a monocrystal ingot conveying/attitude-adjusting device (20A) having hands (205, 206) for holding said monocrystal ingot, a travelling portion (201) which moves along said rail and is disposed above said hands (206, 207) and an intermediate portion (202) disposed between said hands and said travelling portion and arranged to move said hands so that said grinding rotation centers instructed on said two end surfaces of said ingot held by said hands are made to coincide with the rotation center line of said rotational clamp shaft of said monocrystal ingot surface-grinding device, said monocrystal ingot surface-grinding device having a base (24); and an X-Y-$\theta\phi$ stage (24) having an X-stage (26) which is moved with respect to said base in a direction of an X-axis, a Y-stage (28) which is moved in a direction of a Y-axis, a $\theta$-stage (3) which is rotated around an axis which parallels said X-axis and a $\phi$-stage (32) which is rotated around an axis which parallels said Y-axis.

2. A monocrystal ingot conveying/surface-grinding apparatus according to claim 1, wherein said Y-stage (28) is fastened to said X-stage (26), said $\theta$-stage (30) is fastened to said Y-stage, said $\phi$-stage (32) is fastened to said $\theta$-stage and said hands (205, 206) are fastened to said $\phi$-stage or said base (24).

3. A monocrystal ingot conveying/surface-grinding apparatus according to claim 2, wherein said X-axis extends in a horizontal direction and said Y-axis extends in a perpendicular direction.

4. A monocrystal ingot conveying/surface-grinding apparatus according to claim 2 further comprising:

a feed screw (265) journalled by said X-stage (26) and having a right-hand thread and a left-hand thread formed in its single shaft;

a pair of nuts (266) respectively received by said left-hand thread and said right-hand thread;

a pair of slide blocks (268) which are moved together with said nuts and having inclined surfaces which do not run parallel to the axial direction of said feed screw;

a pair of fixing blocks (282) secured to said Y-stage (28) in such a manner that their surfaces running parallel to said inclined surfaces are disposed to confront said inclined surfaces of said slide blocks; and means (271, 281) for guiding said slide blocks along said inclined surfaces of said fixing blocks, whereby the interval between said X-stage and said Y-stage is changed by rotating said feed screw.

5. A monocrystal ingot conveying/surface-grinding apparatus according to claim 1, wherein said monocrystal ingot surface grinding devices (221A to 225A) have through holes (79A, 79B) in the shaft core portions of said rotational clamp shafts, and includes cameras (84A, 84B) for outputting image signals;

endoscopes (82A, 82B) the base portions of which are disposed adjacent to image lenses of said cameras, while the front portions of the same are inserted into said through holes; and means (90) for detecting the positions of said grinding rotation centers with respect to said rotation center lines of said rotational clamp shafts in accordance with said image signals.

6. A monocrystal ingot conveying/surface-grinding apparatus according to claim 5, wherein said endoscopes are bore scopes (82A, 82B) having light guides (824), light sources (86A, 86B) are fastened to the base portions of said light guides and light emitted from said light sources is emitted from the front portions of said bore scopes so as to irradiate the end surfaces of said monocrystal ingot.

7. A monocrystal ingot conveying/surface-grinding apparatus according to claim 6, wherein said bore scopes, having the outer surface to which bearings (80A, 80B) are fitted, are inserted into said through holes (79A, 79B).

8. A monocrystal ingot conveying/surface-grinding apparatus according to claim 1 further comprising:

a loader (14) disposed below said rail (16A) and arranged to convey said monocrystal ingot (10) which has not been ground by said monocrystal ingot surface grinding devices (221A to 225A); and an unloader (23) disposed below said rail and arranged to convey said monocrystal ingot (11) which has been ground by said monocrystal ingot surface grinding devices.

9. A monocrystal ingot conveying/surface-grinding apparatus according to claim 8, wherein both said loader (14) and said unloader (23) are respectively conveyers.

* * * * *